(12) United States Patent
Ueno et al.

(10) Patent No.: US 11,522,407 B2
(45) Date of Patent: Dec. 6, 2022

(54) ELECTRONIC APPARATUS

(71) Applicant: KYB CORPORATION, Tokyo (JP)

(72) Inventors: Sayaka Ueno, Tokyo (JP); Yuu Eguchi, Tokyo (JP); Syun Matsuda, Tokyo (JP)

(73) Assignee: KYB Corporation, Tokyo (JP)

( * ) Notice: Subject to any disclaimer, the term of this patent is extended or adjusted under 35 U.S.C. 154(b) by 417 days.

(21) Appl. No.: 16/616,123

(22) PCT Filed: Jun. 19, 2018

(86) PCT No.: PCT/JP2018/023266
§ 371 (c)(1),
(2) Date: Nov. 22, 2019

(87) PCT Pub. No.: WO2019/004004
PCT Pub. Date: Jan. 3, 2019

(65) Prior Publication Data
US 2021/0029843 A1    Jan. 28, 2021

(30) Foreign Application Priority Data

Jun. 26, 2017  (JP) ............................. JP2017-124069

(51) Int. Cl.
*H02K 5/24*  (2006.01)
*H02K 11/33*  (2016.01)
(Continued)

(52) U.S. Cl.
CPC ............. *H02K 5/24* (2013.01); *H02K 5/1732* (2013.01); *H02K 5/225* (2013.01); *H02K 7/083* (2013.01);
(Continued)

(58) Field of Classification Search
CPC ...... H02K 5/1732; H02K 5/225; H02K 11/33; H02K 11/30; H02K 11/38; H02K 5/22;
(Continued)

(56) References Cited

U.S. PATENT DOCUMENTS

2014/0265749 A1*  9/2014  Motoda ................. H02K 11/33
                                                310/68 R
2015/0054365 A1*  2/2015  Kinoshita ............... H02K 5/10
                                                310/71
(Continued)

FOREIGN PATENT DOCUMENTS

JP           05-93091 U      12/1993
JP        2014-036033 A       2/2014
(Continued)

OTHER PUBLICATIONS

International Search Report dated Sep. 18, 2018 in International Application No. PCT/JP2018/023266.

*Primary Examiner* — Alexander A Singh
(74) *Attorney, Agent, or Firm* — Saliwanchik, Lloyd & Eisenschenk

(57) ABSTRACT

[Object] To provide an electronic apparatus capable of inhibiting a failure due to dropping of a screw from occurring.
[Solving Means] An electronic apparatus 100 according to an embodiment of the present invention includes: a casing 10; a cover portion (case cover 20); a circuit board 22; a screw member 80; and a facing member (holding member 60). The cover portion has a first surface and a second surface and is to be attached to an opening portion 11 of the casing 10, the first surface including a screw hole 203 and facing the casing 10, the second surface being opposite to the first surface. The circuit board 22 is to be disposed on the first surface. The screw member 80 includes a head portion 81 and a shank 82 and fixes the circuit board 22 to the cover portion, the head portion 81 engaging with the circuit board 22, the shank 82 including a groove 82s and passing through the circuit board 22, the groove 82s being screwed into the screw hole 203. The facing member is to be disposed inside
(Continued)

the casing 10 and faces the head portion 81 with a distance (L1) smaller than a length (L2) of the shank 82.

6 Claims, 6 Drawing Sheets

(51) Int. Cl.
| | |
|---|---|
| *H02K 11/01* | (2016.01) |
| *H02K 5/173* | (2006.01) |
| *H02K 5/22* | (2006.01) |
| *H02K 7/08* | (2006.01) |
| *H02K 21/14* | (2006.01) |
| *B62D 5/04* | (2006.01) |
| *H02K 3/50* | (2006.01) |
| *H05K 7/14* | (2006.01) |
| *H05K 7/20* | (2006.01) |

(52) U.S. Cl.
CPC ......... *H02K 11/0141* (2020.08); *H02K 11/33* (2016.01); *H02K 21/14* (2013.01); *B62D 5/0406* (2013.01); *H02K 3/50* (2013.01); *H02K 2203/09* (2013.01); *H02K 2211/03* (2013.01); *H05K 7/1417* (2013.01); *H05K 7/2039* (2013.01)

(58) Field of Classification Search
CPC ........... H02K 5/24; H02K 3/50; H02K 7/083; H02K 11/0141; H02K 5/1735; H02K 21/14; H02K 2211/03; H02K 2203/09; H05K 7/1417; H05K 7/2039; B62D 5/0406
USPC .......................................................... 310/89
See application file for complete search history.

(56) References Cited

U.S. PATENT DOCUMENTS

| | | | | |
|---|---|---|---|---|
| 2015/0155759 | A1* | 6/2015 | Matsuo ................ | B62D 5/0406 310/52 |
| 2016/0035497 | A1* | 2/2016 | Sengoku ................. | H01G 2/04 429/90 |
| 2017/0069559 | A1 | 3/2017 | Yamamoto et al. | |
| 2019/0077440 | A1* | 3/2019 | Yamashita ........... | B62D 5/0406 |

FOREIGN PATENT DOCUMENTS

| | | |
|---|---|---|
| JP | 2016-033986 A | 3/2016 |
| JP | 2017-050493 A | 3/2017 |
| WO | WO-2016158978 A1 * 10/2016 | ........... B62D 5/0403 |

* cited by examiner

ELECTRONIC APPARATUS

CROSS-REFERENCE TO RELATED APPLICATIONS

This application is the U.S. national stage application of International Patent Application No. PCT/JP2018/023266, filed Jun. 19, 2018, which claims the benefit under 35 U.S.C. § 119 of Japanese Patent Application No. 2017-124069, filed Jun. 26, 2017, the disclosures of each of which are incorporated herein by reference in their entirety.

TECHNICAL FIELD

The present invention relates to an electronic apparatus including a circuit board that is screwed.

BACKGROUND ART

For example, there is known an electronic apparatus including an electric motor, a circuit board on which a control circuit that drives the electric motor, and a casing that houses the electric motor and the circuit board. For example, Patent Literature 1 discloses a motor unit in which a rotor, a stator, and a motor drive control device are attached to a lower case, the motor drive control device including a substrate and a heat sink attached to the substrate by a plurality of fixing bolts.

CITATION LIST

Patent Literature

Patent Literature 1: Japanese Patent Application Laid-open No. 2016-33986

DISCLOSURE OF INVENTION

Technical Problem

For example, in-vehicle electronic apparatuses are exposed to an environment that is constantly subjected to temperature changes and vibration, so that screws constituting the electronic apparatus are likely to loosen. For example, if a screw that fixes a substrate to a heat sink loosens and falls off the substrate, there is a risk that the device is damaged or a failure occurs due to the dropped screw.

In view of the circumstances as described above, it is an object of the present invention to provide an electronic apparatus capable of inhibiting a failure due to dropping of a screw from occurring.

Solution to Problem

In order to achieve the above-mentioned object, an electronic apparatus according to an embodiment of the present invention includes: a casing; a cover portion; a circuit board; a screw member; and a facing member.

The casing includes an opening portion.

The cover portion has a first surface and a second surface and is to be attached to the opening portion, the first surface including a screw hole and facing the casing, the second surface being opposite to the first surface.

The circuit board is to be disposed on the first surface.

The screw member includes a head portion and a shank and fixes the circuit board to the cover portion, the head portion engaging with the circuit board, the shank including a groove and passing through the circuit board, the groove being screwed into the screw hole.

The facing member is to be disposed inside the casing and faces the head portion with a distance smaller than a length of the shank.

In the electronic apparatus, for example, in the case where the head portion of the screw member is disposed on the lower side in the vertical direction than the shank, even if the screw member is loosened to about to drop downward, the head portion of the screw member is in contact with the facing member before the shank of the screw member comes off from the screw hole, which inhibits the screw member from dropping from the substrate and the cover portion. As a result, it is possible to inhibit a failure of the apparatus due to dropping of the screw member from occurring.

The shank may include a first shank and a second shank, the first shank being an area in which the groove is formed, the second shank protruding toward the second surface more than the first shank. In this case, the facing member faces the head portion with a distance larger than a length of the first shank.

Alternatively, the head portion may have a height larger than a length of the shank.

The cover portion may further include an external connection terminal. The external connection terminal is disposed on the second surface and is electrically connected to the circuit board.

The cover portion may include a block body formed of metal, and may include, for example, a heat sink.

The facing member may be a holding member that holds a bearing.

MODE(S) FOR CARRYING OUT THE INVENTION

Hereinafter, embodiments of the present invention will be described with reference to the drawings.

First Embodiment

Figure 1:
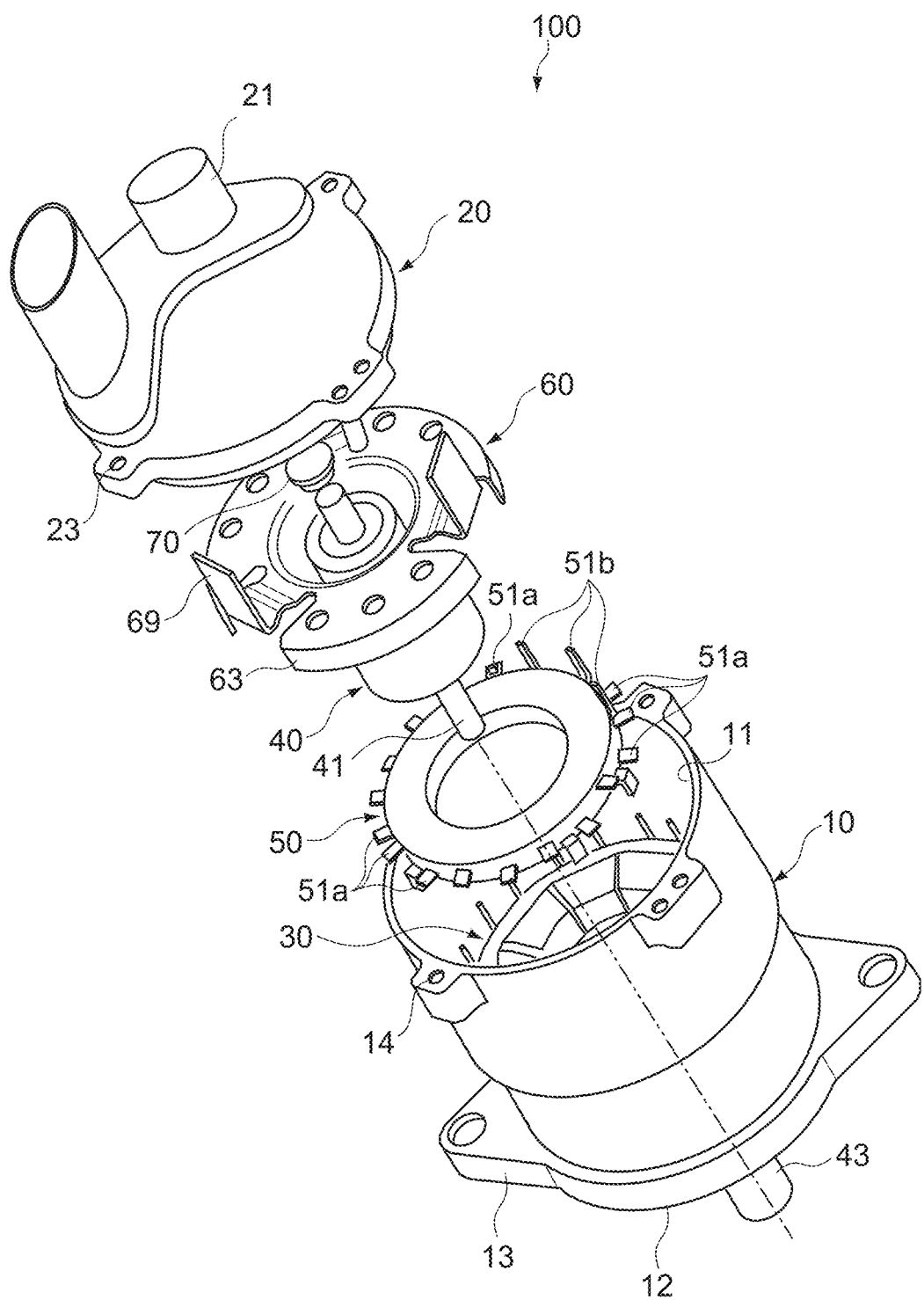
FIG. 1 is an exploded perspective view showing an electronic apparatus according to an embodiment of the present invention.
Figure 2:
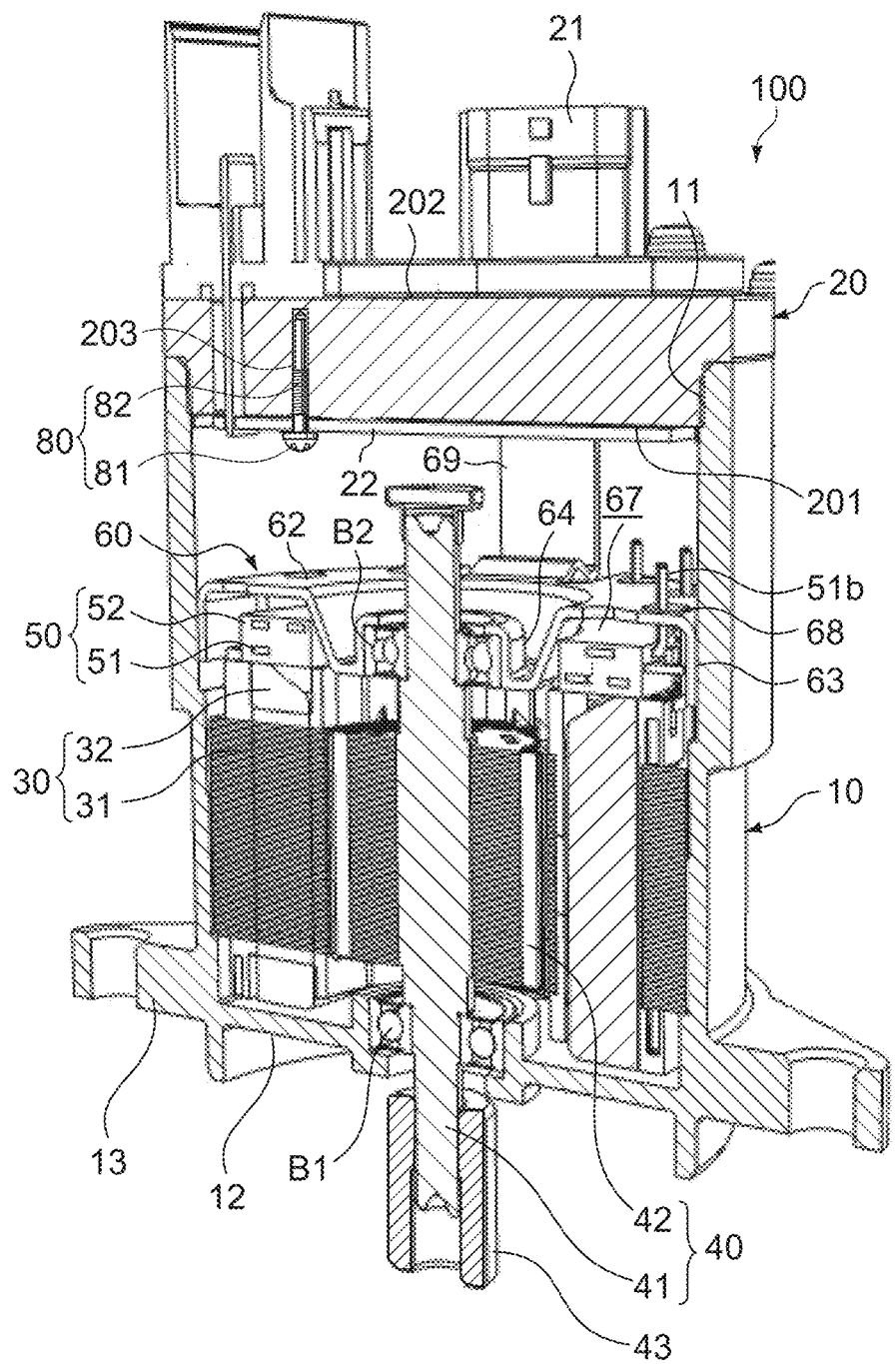
FIG. 2 is a cross-sectional perspective view of a main portion of the electronic apparatus.

FIG. 1 is an exploded perspective view showing a rotating electrical machine 100 as an electronic apparatus according to an embodiment of the present invention. FIG. 2 is a cross-sectional perspective view of a main portion of the rotating electrical machine 100.

The rotating electrical machine 100 according to this embodiment is used as an electric steering device (not shown) for a vehicle, and includes a motor unit that applies a steering assist force to a steering shaft.

The rotating electrical machine 100 includes a casing 10, a case cover 20, a stator 30, a rotor 40, a bus-bar unit 50, and a holding member 60. The stator 30, the rotor 40, the bus-bar unit 50, and the holding member 60 constitute a motor unit of the rotating electrical machine 100.

(Casing)

The casing 10 is formed in a substantially cylindrical shape including an opening portion 11 and a bottom portion 12 facing the opening portion 11. The casing 10 is formed of a metal material such as aluminum, and houses the stator 30, the rotor 40, the bus-bar unit 50, the holding member 60, and the like.

(Case Cover)

The case cover 20 is assembled to the opening portion 11 of the casing 10 via a seal ring, thereby constituting a cover portion that seals the inside of the casing 10. As shown in FIG. 1, a plurality of brackets 23 including screw insertion holes is provided at the peripheral edge of the case cover 20, and the case cover 20 is screwed and fixed to a plurality of fixing brackets 14 provided at the peripheral edge of the opening portion 11 of the casing 10 via the brackets 23.

The case cover 20 may be provided with a breathing hole that allows the inside of the casing 10 to communicate with the outside air. The case cover 20 has an external surface 202 (second surface) on which a connection portion 21 (external connection terminal) to be electrically connected to an external power source (not shown) is provided, and an inner surface 201 (first surface) on which a circuit board 22 that faces the inside of the casing 10 and is to be electrically connected to the bus-bar unit 50 is provided (see FIG. 2).

The circuit board 22 includes various electronic parts (not shown) constituting an ECU (Electronic Control Unit) of an electric steering device. Examples of the electronic parts include a connector part to be electrically connected to the bus-bar unit 50 in addition to a CPU and a memory. The bus-bar unit 50 is electrically connected to the above-mentioned external power source via the connection terminal 21, and thus, the sealing property of the casing 10 by the case cover 20 is improved.

The circuit board 22 is fixed to the case cover 20 via one or a plurality of screw members 80. The screw member 80 includes a head portion 81 that engages (is in contact) with the surface (lower surface in FIG. 2) of the circuit board 22, and a shank 82 that passes through the circuit board 22. The shank 82 includes a groove screwed into a screw hole 203 provided on the inner surface of the case cover 20. As will be described below, the screw member 80 is disposed inside the casing 10 so that the head portion 81 and the holding member 60 face with each other with a distance smaller than the length of the shank 82.

The case cover 20 typically includes a block body formed of a metal material, and functions as a heat sink for heat dissipation of the circuit board 22. The metal material forming the case cover 20 may be the same as or different from that of the casing 10.

(Stator) The stator 30 includes a stator core 31 disposed inside the casing 10, and a stator coil 32 wound around the stator core 31. The stator core 31 is formed of a magnetic material, and includes, for example, a laminate of a plurality of magnetic steel plates. The stator core 31 is fixed to the casing 10 by being fitted to the inner periphery of the casing 10. The stator coil 32 includes U-phase, V-phase, and W-phase electromagnetic coils, and ends of the electromagnetic coils are electrically connected to the bus-bar unit 50.

(Rotor)

The rotor 40 includes a drive shaft 41 and a rotor core 42 to be attached to the drive shaft 41. The drive shaft 41 is disposed along the axial center of the casing 10, and is press-fitted into a through hole formed in the center of the rotor core 42. The drive shaft 41 is rotatably supported by the casing 10 via a bearing B1 (first bearing) and a bearing B2 (second bearing). The rotor core 42 includes a plurality of magnetic poles arranged in the circumferential direction. The rotor 40 is disposed inside the stator 30, and rotates the drive shaft 41 around the axis by the electromagnetic action with the stator 30.

One end (lower end in FIG. 1 and FIG. 2) of the drive shaft 41 passes through the bottom portion 12 of the casing 10, and includes a gear portion 43 at the tip. The gear portion 43 meshes with a counterpart gear (not shown) that communicates with a steering shaft, and transmits the rotation of the drive shaft 41 to the above-mentioned steering shaft. The bottom portion 12 of the casing 10 includes a flange portion 13 to be connected to a counterpart device, and is connected to the device via a plurality of bolts.

The other end (upper end in FIG. 1 and FIG. 2) of the drive shaft 41 faces the lower surface of the case cover 20 with a distance. A magnet 70 is fixed to the other end of the drive shaft 41, and the rotational speed of the rotor 40 is detected via a magnetic sensor (not shown) on the circuit board 22 facing the magnet 70.

One bearing B1 (first bearing) is attached to the bottom portion 12 of the casing 10, and rotatably supports one end side of the drive shaft 41. The other bearing B2 (second bearing) rotatably supports the other end side of the drive shaft 41. The bearing B2 is disposed between the rotor core 42 and the case cover 20, and is fixed to the casing 10 via the holding member 60.

(Bus-Bar Unit)

The bus-bar unit 50 includes a plurality of bus bars 51 formed of a conductive material, and an insulating bus-bar holder 52 that encloses the bus bars (see FIG. 2). The bus-bar holder 52 includes an annular molded body. The plurality of bus bars 51 includes a plurality of connection terminals 51a that protrudes radially outward from the outer peripheral surface of the bus-bar holder 52, and a plurality of power source terminals 51b that protrudes in the axial direction from the top surface of the bus-bar holder 52 (see FIG. 1).

The bus-bar unit 50 is disposed inside the casing 10, and is connected to the stator 30 concentrically with the drive shaft 41. The plurality of connection terminals 51a is electrically connected to one ends of the U-, V-, and W-phase stator coils 32, and the plurality of power source terminals 51b is electrically connected to a connector part (not shown) on the circuit board 22 fixed to the case cover 20.

(Holding Member)

Figure 3:
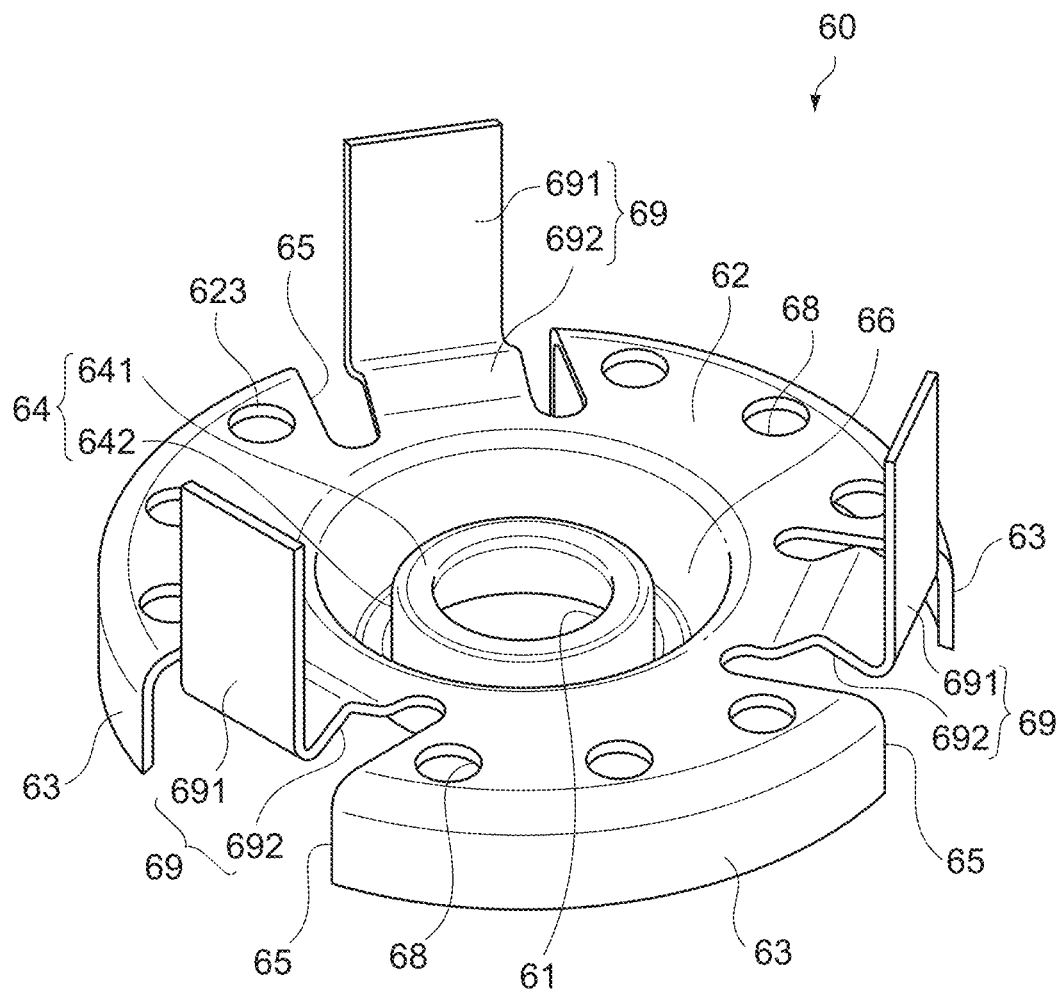
FIG. 3 is an overall perspective view of a holding member in the electronic apparatus.
Figure 4:
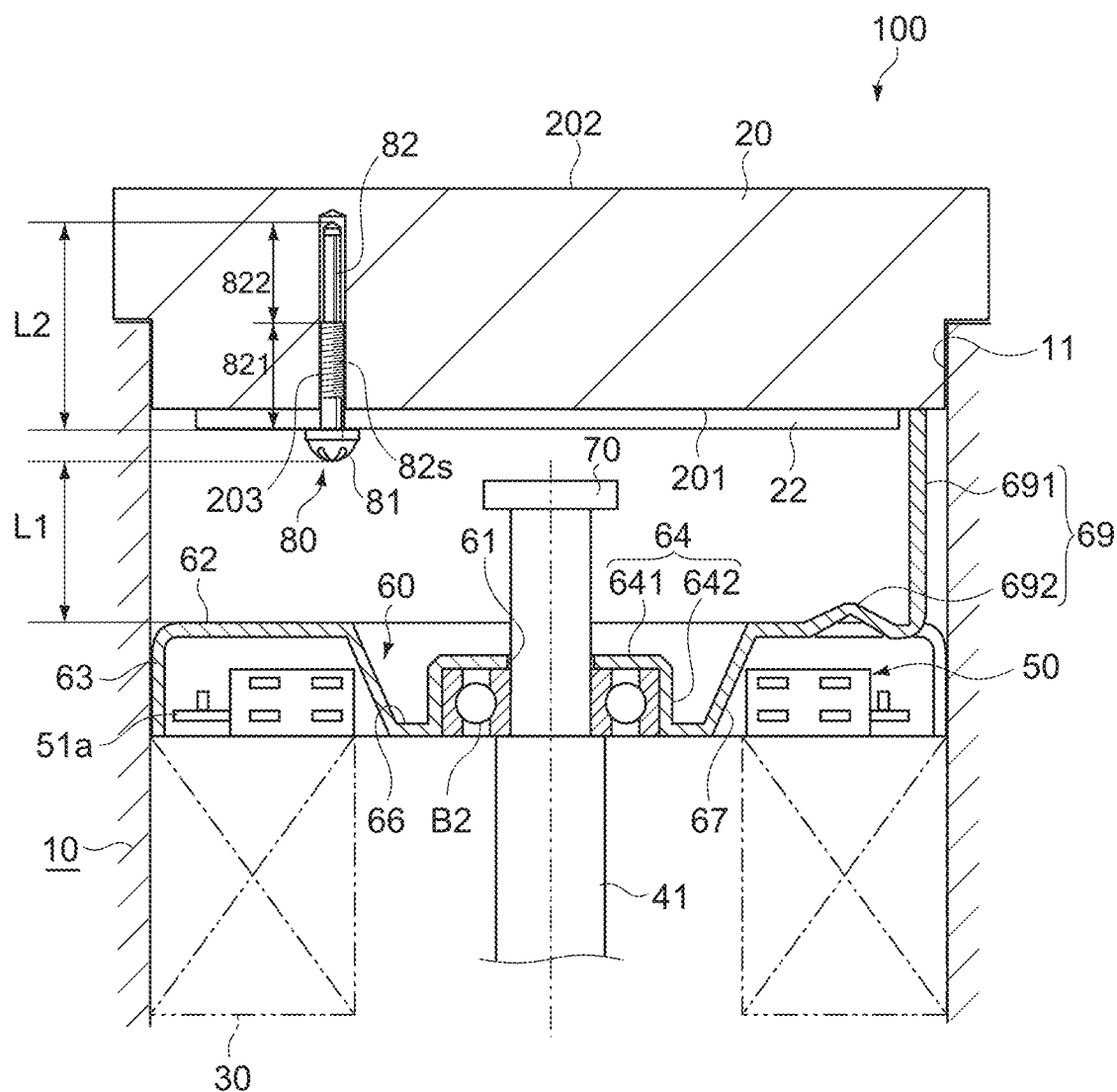
FIG. 4 is a cross-sectional view of a main portion of the electronic apparatus.

FIG. 3 is an overall perspective view of the holding member 60, and FIG. 4 is a cross-sectional view of the holding member 60 inside the casing 10.

The holding member 60 is for positioning and holding the bearing B2 in the casing 10, and includes a press-molded body of a metal plate. In this embodiment, the holding member 60 is prepared by performing a deep drawing process and a bending process on a metal plate to have a three-dimensional shape shown in FIG. 3. Since the holding member 60 is formed of a metal material, the frictional heat generated in the bearing B2 can be efficiently released to the casing 10 via the holding member 60, and the heat dissipation of the bearing B2 is improved. The metal plate forming the holding member 60 is not particularly limited, and the holding member 60 is formed to have a thickness such that the holding member 60 is elastically deformed moderately while ensuring a necessary strength.

The holding member 60 may be formed of a magnetic material or a non-magnetic material. By forming the holding member 60 of a magnetic material, a shielding effect of protecting the electronic parts on the circuit board 22 from the influence of an electromagnetic field generated from the stator 30 and the rotor 40 can be achieved. Examples of such a material include an SPCC (cold rolled steel sheet). However, it goes without saying that the present technology is not limited thereto.

The holding member 60 has a substantially disc-shaped shallow dish shape, and a central hole portion 61 through which the drive shaft 41 passes is provided at the center thereof. The holding member 60 includes a main body 62, peripheral surface portions 63, an annular wall portion 64, a housing portion 67, and protruding pieces 69.

The main body 62 has an annular shape concentric with the central hole portion 61, and supports the peripheral surface portions 63, the annular wall portion 64, and the protruding pieces 69.

The peripheral surface portion 63 corresponds to the outer peripheral surface forming the outer diameter of the holding member 60, and is configured by a part of the cylindrical surface depending from the outer peripheral edge of the main body 62. The peripheral surface portion 63 has an outer diameter that is slightly larger than the inner diameter of the casing 10 in a natural state (state of the part alone shown in FIG. 3) before being incorporated into the casing 10. For this reason, when the holding member 60 is incorporated into the casing 10, the peripheral surface portion 63 is elastically deformed radially inward, is press-fitted into the casing 10, and is held on the inner periphery surface of the casing 10 by the elastic force.

The peripheral surface portions 63 are formed by being divided in the circumferential direction along the outer peripheral surface of the holding member 60. A plurality of notches 65 is formed on the outer peripheral surface of the holding member 60, and areas in which the notches 65 are not formed form the peripheral surface portions 63. The notches 65 are inwardly cut out from the outer peripheral surface of the holding member 60 to the middle of the main body 62, and are formed on the outer peripheral surface of the holding member 60 at equal angular intervals (120° in the illustrated example). Therefore, also the peripheral surface portions 63 are formed on the outer peripheral surface of the holding member 60 at equal angular intervals. Since the peripheral surface portions 63 are formed by being divided in the circumferential direction of the holding member 60, each of the peripheral surface portions 63 can be easily deformed independently. As a result, the peripheral surface portions 63 are held by the casing 10 with a uniform pressing force in the circumferential direction.

The annular wall portion 64 is formed concentrically with the central hole portion 61, and has a cylindrical shape provided inside the main body 62. The annular wall portion 64 includes a top plate portion 641 and a cylindrical portion 642.

The top plate portion 641 has an annular plate shape including the central hole portion 61, and constitutes the bottom portion of the annular wall portion 64. The cylindrical portion 642 has a cylindrical shape depending from the outer peripheral edge of the top plate portion 641, and constitutes the peripheral wall of the annular wall portion 64. The annular wall portion 64 integrally holds the bearing B2 by fitting or fitting action of the cylindrical portion 642 and the outer race of the bearing B2. At this time, the lower end portion (end portion opposite to the top plate portion 641 side) of the cylindrical portion 642 may be caulked to achieve integral connection with the bearing B2.

As shown in FIG. 3 and FIG. 4, the annular wall portion 64 is provided at the bottom of a recess 66 provided at the center of the main body 62. The recess 66 is formed in an annular shape concentric with the central hole portion 61, and the inner periphery surface thereof corresponds to the outer peripheral surface of the cylindrical portion 642 of the annular wall portion 64.

The housing portion 67 is provided between the peripheral surface portions 63 and the annular wall portion 64, and is formed to have a size capable of housing the bus-bar unit 50. The housing portion 67 is formed in an annular shape concentric with the central hole portion 61, and is defined by the main body 62, the peripheral surface portions 63, and the cylindrical portion 642 of the annular wall portion 64. Note that although the inner periphery surface of the housing portion 67 is formed in a taper surface, the present technology is not limited thereto, and the inner periphery surface of the housing portion 67 may be formed in a cylindrical surface.

The plurality of connection terminals 51a of each bus bar 51 in the bus-bar unit 50 is connected to one ends of the U-, V-, and W-phase stator coils 32 in the housing portion 67 by welding or the like. The power source terminals 51b of each bus bar 51 pass through arbitrary three through-hole portions 68 among a plurality of through-hole portions 68 provided along the outer peripheral edge of the main body 62 at equal intervals, and are electrically connected to the circuit board 22 on the case cover 20. As a result, it is possible to easily pull out each of the power source terminals 51b of the bus-bar unit 50 toward the opening portion 11 of the casing 10 (see FIG. 2).

In this embodiment, the elastic support portion 692 is formed by being bent several times in the height direction of the holding member 60 as shown in FIG. 3 and FIG. 4. As a result, it is possible to adjust the position of the protruding piece portion 691 in the radial direction of the main body 62. Further, since each protruding piece portion 691 is located on the center side of the main body 62, the main body 62 is inhibited from being lifted due to the reaction of deformation of the elastic support portion 692.

The protruding pieces 69 each have the same configuration, and are connected to the bottom portion (minimum radius portion) of the corresponding notches 65. The protruding pieces 69 each include a protruding piece portion 691 and an elastic support portion 692.

The protruding piece portion 691 is located on the outer peripheral side of the holding member 60, and is configured by a rectangular plate portion having a thickness direction in the radial direction of the holding member 60. The elastic support portion 692 extends radially outward the holding member 60 from the bottom portion of the corresponding notches 65, and is connected to the lower end of the protruding piece portion 691. The elastic support portion 692 is configured to be elastically deformable in the height direction of the holding member 60 relative to the main body 62, and elastically supports the protruding piece portion 691.

In this embodiment, the elastic support portion 692 is formed by being bent several times in the height direction of the holding member 60 as shown in FIG. 3 and FIG. 4. As a result, it is possible to adjust the position of the protruding piece portion 691 in the radial direction of the main body 62. Further, since each protruding piece portion 691 is located on the center side of the main body 62, the main body 62 is prevented from being lifted due to the reaction of deformation of the elastic support portion 692.

Further, since the protruding pieces 69 are arranged at equal angular intervals on the circumference around the drive shaft 41, it is possible to apply a uniform pressing force to the holding member 60 via the protruding pieces 69, and more appropriately hold the bearing B2.

Further, as shown in FIG. 4, the holding member 60 is configured as a facing member that faces, with a predetermined distance, the screw member 80 that fixes the circuit board 22 to the case cover 20.

As described above, the screw member 80 includes the head portion 81 that engages with the circuit board 22, and the shank 82 that passes through the circuit board 22 and is screwed into the screw hole 203 of the case cover 20. The holding member 60 is disposed inside the casing 10 at a position facing the head portion 81 of the screw member 80 with a distance (L1) smaller than a length (L2) of the shank 82 of the screw member 80. The position at which the screw member 80 is provided is not particularly limited. For example, the screw member 80 is provided on each of places at the peripheral edge of the circuit board 22.

The adjustment of the relative position between the holding member 60 and the circuit board 22 may be performed by the protruding pieces 69 of the holding member 60. For example, the length of each protruding piece portion 691 of the holding member 60 is set to be the sum of the distance L1 and the height of the head portion 81, and the case cover 20 is incorporated into the casing 10 from the opening portion 11 to a position where the tip of each protruding piece portion 691 is in contact with the circuit board 22 or the case cover 20.

Figure 5:
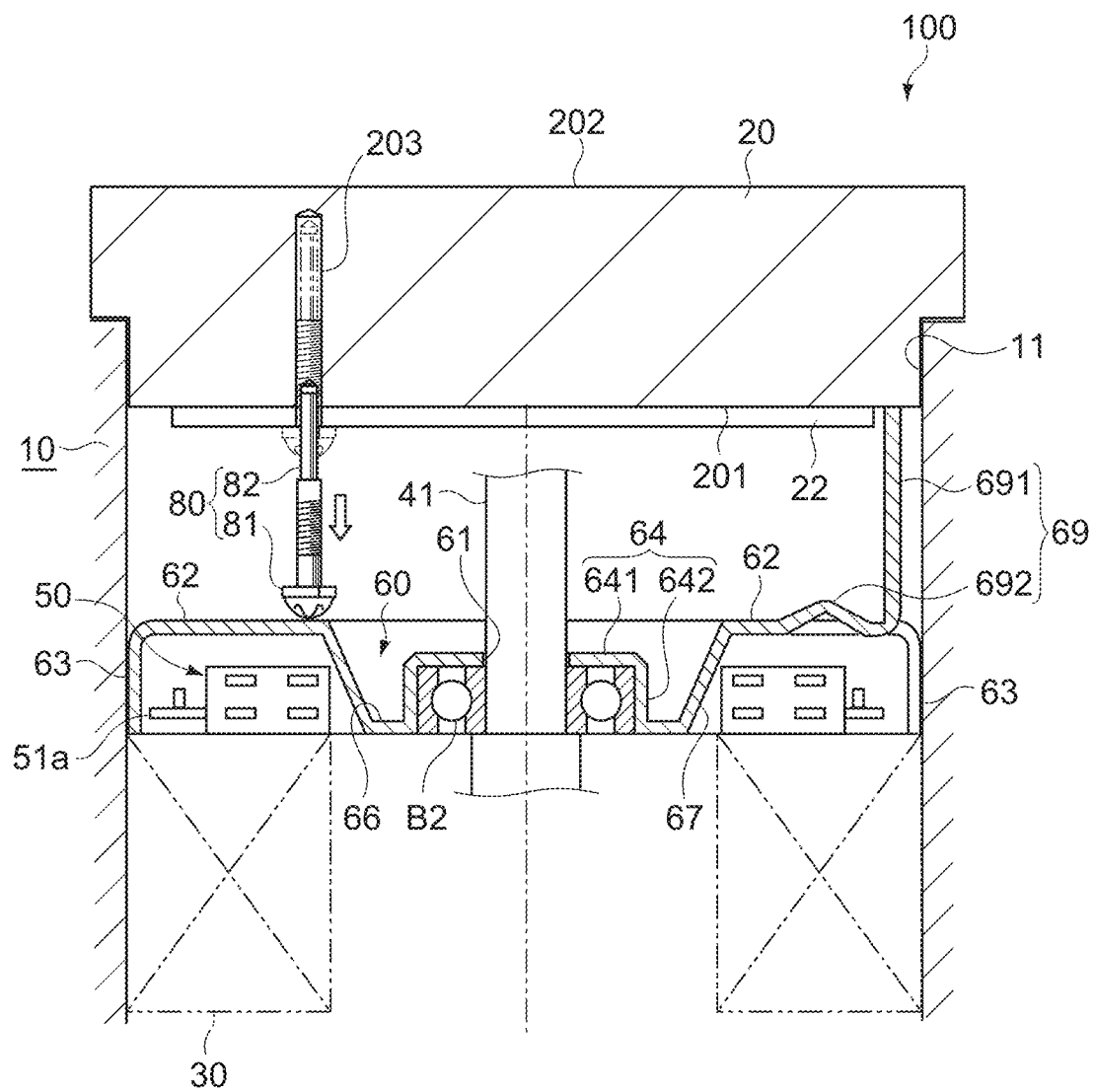
FIG. 5 is a cross-sectional view of a main portion for describing the operation of the electronic apparatus.

For example, as shown in FIG. 5, in the case where the head portion 81 of the screw member 80 is disposed on the lower side in the vertical direction than the shank 82, even if the screw member 80 is loosened due to the influence of temperature changes, vibration, or the like to about to fall downward as indicated by a white arrow in the figure, the head portion 81 of the screw member 80 is in contact with the holding member 60 (main body 62) before the shank 82 of the screw member 80 completely comes off from the screw hole 203, which inhibits the screw member 80 from further coming off from the screw hole 203.

Therefore, in accordance with this embodiment, the screw member 80 is inhibited from dropping from the circuit board 22 and the case cover 20. As a result, it is possible to inhibit a failure of the rotating electrical machine 100 due to the intrusion of dropped screw member 80 into the monitor unit from occurring.

Further, in accordance with this embodiment, it is not necessary to apply an adhesive to the shank (groove) to inhibit the screw member from dropping or separately install a dedicated member for inhibiting the screw member from dropping, the small rotating electrical machine 100 having an electromechanical integrated structure can be configured at low cost.

In this embodiment, as shown in FIG. 4, the shank 82 of the screw member 80 includes a first shank 821 that is an area in which a groove 82s is formed, and a second shank 822 that protrudes toward the outer surface 202 of the case cover 20 more than the first shank 821. By constituting the screw member 80 with such a rod end screw, the assembling property of the screw member 80 with respect to the screw hole 203 is improved.

Further, the distance L1 between the head portion 81 of the screw member 80 and the main body 62 of the holding member 60 is set to be larger than the length of the first shank 821 of the shank 82 in the axial direction. As a result, since the shank 82 can be set to a desired length without forming the groove 82s longer than necessary, it is possible to effectively inhibit the dropping of the screw member 80 as described above from occurring while suppressing the reduction in assembly workability of the screw member 80.

Further, in this embodiment, since the case cover 20 includes a block body (heat sink) formed of metal and can be easily formed to have an arbitrary thickness, there is an advantage that even a relatively long screw hole 203 can be easily formed.

Second Embodiment

Figure 6:
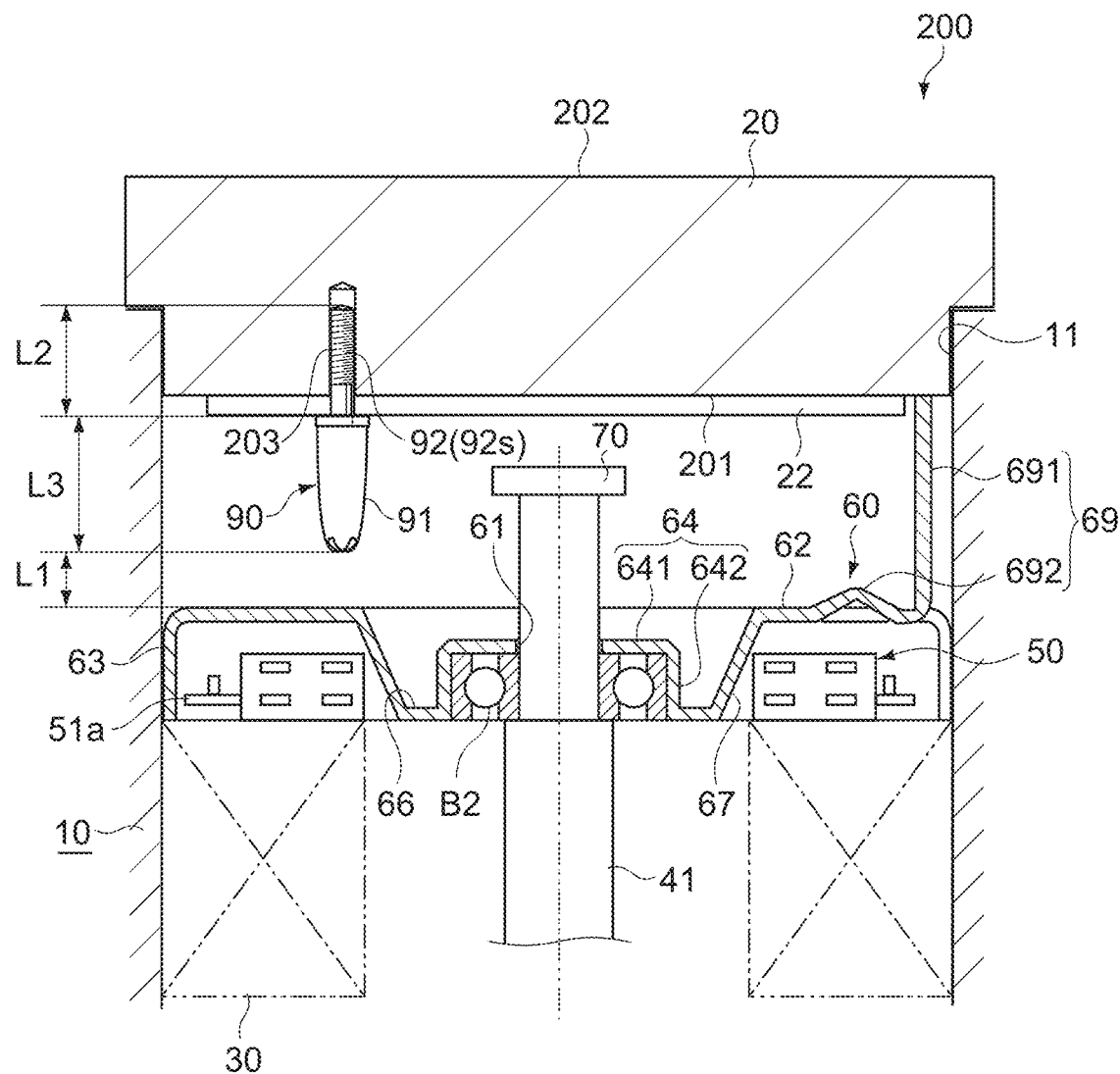
FIG. 6 is a cross-sectional view of a main portion of an electronic apparatus according to another embodiment of the present invention.

FIG. 6 is a schematic cross-sectional view of a main portion of a rotating electrical machine 200 according to a second embodiment of the present invention.

Hereinafter, configurations different from those of the first embodiment will be mainly described, and configuration similar to those of the first embodiment will be denoted by the same reference symbols and description thereof will be omitted or simplified.

The rotating electrical machine 200 according to this embodiment includes a screw member 90 that fixes the circuit board 22 to the case cover 20. As in the first embodiment, the screw member 90 includes a head portion 91 that engages with the circuit board 22, and a shank 92 that passes through the circuit board 22 and is screwed into the screw hole 203 of the case cover 20, and is disposed inside the casing 10 so that the head portion 91 and the holding member 60 face with each other with the distance (L1) smaller than the length (L2) of the shank 92.

In this embodiment, the configuration of the screw member 90 is different from that in the first embodiment, and the head portion 91 of the screw member 90 has a height (L3) larger than the length (L2) of the shank 92 in the axial direction. Even with such a configuration, the operation and effect similar to those in the first embodiment can be achieved.

Further, in accordance with this embodiment, since the head portion 91 of the screw member 90 has an axial length longer than the shank 92, the operation of screwing the screw member 90 with holding the head portion 91 can be easily performed, and the operation of fixing the circuit board 22 can be easily performed. Further, the shank 92 only needs to have an axial length necessary for forming a groove 92s. However, as in the first embodiment, the shank 92 may have an area corresponding to the rod end portion (second shank 822).

Although the screw member 90 is typically formed of a metal material, the head portion 91 may be formed of a non-metal such as a plastic material and a rubber material, or may be formed of a combination of a metal material and a non-metal material.

Although embodiments of the present invention have been described above, the present invention is not limited to the above-mentioned embodiments and it goes without saying that various modifications can be made.

For example, although the holding member 60 has been described as a facing member facing the head portion of the screw member 80 or 90 as an example in the above-mentioned embodiments, for example, the facing member may be configured by another motor unit constituent member such as the bus-bar unit 50 other than the holding member 60. Further, the above-mentioned facing member may include a member other than the constituent member of the above-mentioned motor unit, or include a flange portion or the like integrally formed in the inner wall surface of the casing 10.

Further, although a screw part including a rod end portion of the shank having a relatively long axial length or a screw part including the head portion having an axial length longer than that of the shank has been adopted as the screw member 80 or 90 in the above-mentioned embodiments, the present technology is not limited thereto, and a general-purpose screw part may be used. In this case, by making the relative position between the circuit board 22 and the facing member such as the holding member 60 relatively close to each other, the operation and effect similar to those in the above-mentioned embodiments can be achieved.

Further, although the rotating electrical machine 100 used as an electric steering device for a vehicle has been described as an example of an electronic apparatus in the above-mentioned embodiment, the rotating electrical machine 100 is applicable also to a rotating electrical machine (motor) for other purposes. Further, the electronic apparatus according to the present invention is applicable not only to a motor but also to another rotating electrical machine such as a generator, and is applicable to another electronic apparatus other than a rotating electrical machine.

The invention claimed is:

1. An electronic apparatus, comprising:
   a casing that includes an opening portion;
   a cover portion that has a first surface and a second surface and is attached to the opening portion, the first surface including a screw hole and facing the casing, the second surface being opposite to the first surface;
   a circuit board disposed on the first surface;
   a screw member that includes a head portion and a shank and fixes the circuit board to the cover portion, the head portion engaging with the circuit board, the shank including a groove and passing through the circuit board, the groove being screwed into the screw hole; and
   a facing member that is to be disposed inside the casing and faces the head portion with a distance smaller than a length of the shank,
   wherein the shank includes a first shank and a second shank, the first shank being an area in which the groove is formed, the second shank protruding toward the second surface more than does the first shank, and
   wherein the facing member faces the head portion with a distance larger than a length of the first shank.

2. The electronic apparatus according to claim 1, wherein the screw member is disposed higher, in a vertical direction, than is the facing member.

3. The electronic apparatus according to claim 1, wherein the facing member is a holding member that holds a bearing.

4. An electronic apparatus, comprising:
   a casing that includes an opening portion;
   a cover portion that has a first surface and a second surface and is to be attached to the opening portion, the first surface including a screw hole and facing the casing, the second surface being opposite to the first surface;
   a circuit board disposed on the first surface;
   a screw member that includes a head portion and a shank and fixes the circuit board to the cover portion, the head portion engaging with the circuit board, the shank including a groove and passing through the circuit board, the groove being screwed into the screw hole and
   a facing member that is to be disposed inside the casing and faces the head portion with a distance smaller than a length of the shank,
   wherein the head portion has a height larger than a length of the shank.

5. The electronic apparatus according to claim 4, wherein the screw member is disposed higher, in a vertical direction, than is the facing member.

6. The electronic apparatus according to claim 4, wherein the facing member is a holding member that holds a bearing.

* * * * *